United States Patent [19]
McLellan et al.

[11] Patent Number: 6,021,046
[45] Date of Patent: Feb. 1, 2000

[54] THERMAL PROTECTION OF ELECTRICAL ELEMENTS SYSTEMS

[75] Inventors: Neil McLellan, Garland; Mike Strittmatter, Carrollton, both of Tex.

[73] Assignee: Dallas Semiconductor Corporation, Dallas, Tex.

[21] Appl. No.: 08/573,600

[22] Filed: Dec. 15, 1995

Related U.S. Application Data

[63] Continuation of application No. 08/296,072, Aug. 24, 1994, abandoned, which is a continuation of application No. 08/075,192, Jun. 9, 1993, abandoned.

[51] Int. Cl.[7] .................................................. H05K 7/20
[52] U.S. Cl. .......................... 361/719; 257/713; 361/816
[58] Field of Search .......................... 174/16.3; 257/704, 257/712, 713; 165/80.2, 80.3, 185; 361/689, 690, 704, 719, 715–722, 736, 752, 800, 816, 818

[56] References Cited

U.S. PATENT DOCUMENTS

| | | | |
|---|---|---|---|
| 3,648,280 | 3/1972 | Jacobs | 340/666 |
| 3,819,929 | 6/1974 | Newman | 240/41.37 |
| 3,909,679 | 9/1975 | Petrl | 330/65 |
| 3,934,177 | 1/1976 | Horbach | 174/15.1 |
| 4,446,916 | 5/1984 | Hayes | 165/185 |
| 4,477,686 | 10/1984 | Nakajima | 136/203 |
| 4,503,327 | 3/1985 | Wilson | 250/261 |
| 4,725,716 | 2/1988 | Entwistle | 219/388 |
| 4,812,949 | 3/1989 | Fontan | 361/704 |
| 4,841,422 | 6/1989 | Groh | 362/294 |
| 4,873,665 | 10/1989 | Jiang | 365/154 |
| 4,915,167 | 4/1990 | Altoz | 165/185 |
| 4,959,646 | 9/1990 | Podkowa | 307/465 |
| 5,003,501 | 3/1991 | Podkowa | 364/569 |
| 5,050,113 | 9/1991 | Podkowa | 364/569 |
| 5,148,860 | 9/1992 | Bettini | 165/41 |
| 5,177,364 | 1/1993 | Gowlett | 250/352 |
| 5,197,142 | 3/1993 | Williams | 395/425 |
| 5,299,156 | 3/1994 | Jiang | 365/154 |

*Primary Examiner*—Gerald Tolin
*Attorney, Agent, or Firm*—Jenkens & Gilchrist, P.C.

[57] ABSTRACT

A thermal protection system that comprises an assembly of at least one electrical component and a heat shield surrounding the electrical component, wherein the heat shield forms a pocket between the electrical element and the heat shield and associated methods. The electrical element has at least one electrical lead. The system permits the electrical lead(s) to increase in temperature sufficient to permit soldering of the electrical lead(s) to a second electrical element. The thermal protection system also comprises a heat sink to protect the electrical element, which comprises a heat capacity material. The system also comprises electrical lead(s) with a low-cross sectional area.

26 Claims, 4 Drawing Sheets

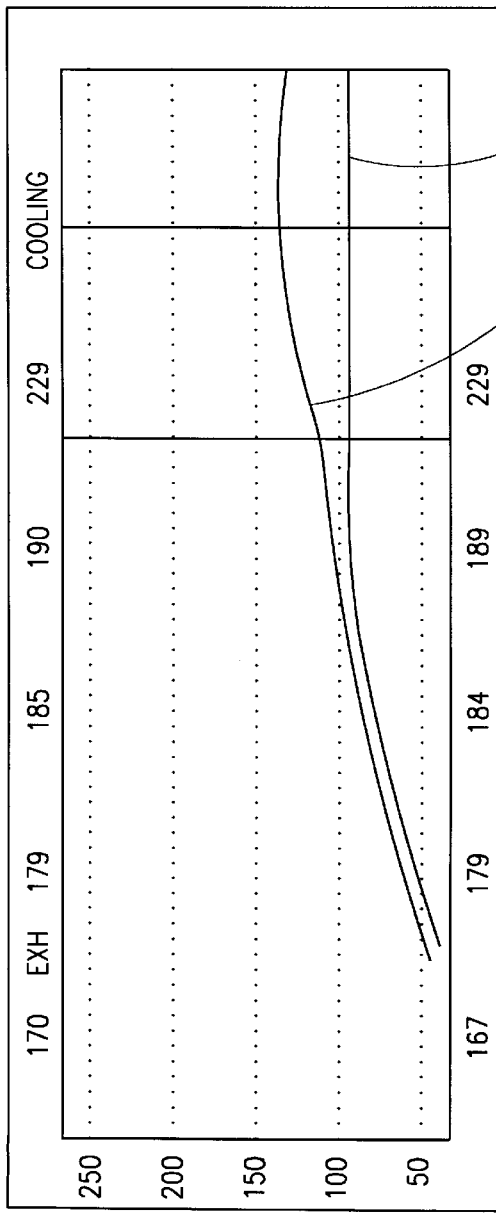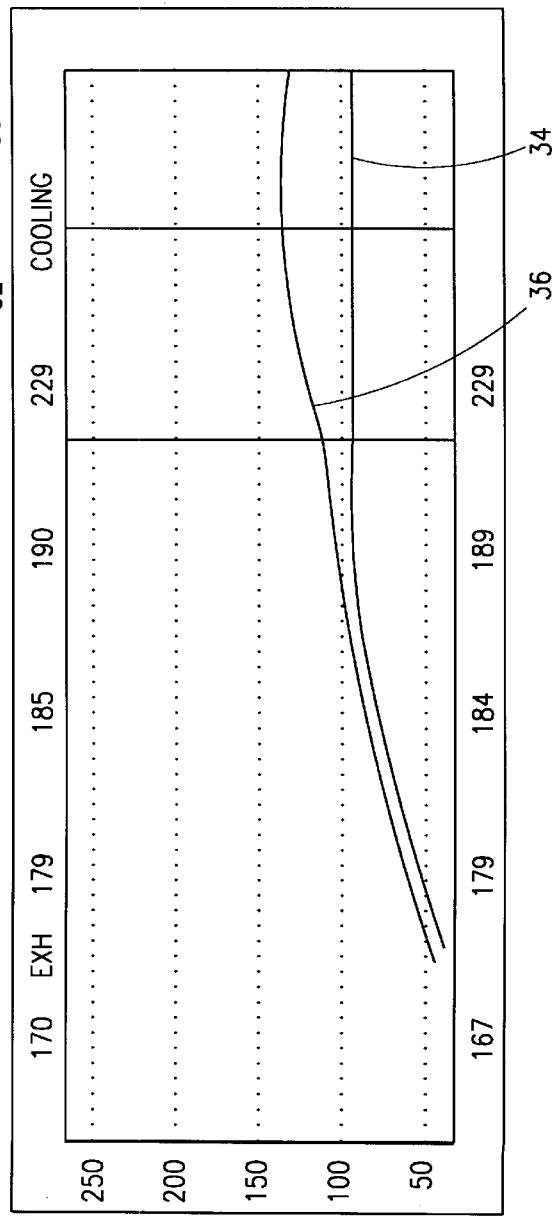

THERMAL PROTECTION OF ELECTRICAL ELEMENTS SYSTEMS

This application is a continuation of Application Ser. No. 08/296,072, filed on Aug. 24, 1994 which was abandoned which is continuation of 08/075,192, filed Jun. 9, 1993 abandoned.

BACKGROUND

For a variety of reasons, modern packaging systems and methods frequently use surface mount packaging technology in addition to or in place of traditional hole insertion packaging technology. This trend has become so pronounced that many board assembly operations do not even have wave solder capabilities at all. Instead, these modern board assembly operations have 100% of their production in the form of surface mount assembly. In response to this trend, component manufacturers must reconfigure and redesign many products to make them compatible with existing surface mount package families.

Assemblies on arrays of electronic components contain temperature sensitive components, such as temperature sensitive integrated circuits, lithium batteries, oscillator crystals, and non-volatile clock circuits (which contain both lithium batteries and oscillator crystals) and poise unique reconfiguration problems. In particular, surface mount reflow operations are typically based on either infrared red (IR) and/or vapor phase reflow. The thermal profile of each operation is usually designed, so that the leads of board components will approach 215° Celsius or higher. Moreover, the exposure profile may range from about two to about eight minutes of reflow exposure, depending on the process parameters and equipment. During this time, the interior of functionally sized modules typically approaches 175° Celsius as an average temperature, which damages elements that are temperature sensitive. For instance, exposure to these temperature ranges would damage lithium batteries, which are generally safe only up to a maximum exposure of 125° Celsius. Current industry approaches have not protected temperature sensitive components in surface mount processes with typical reflow processes.

SUMMARY OF THE INVENTIONS

The present invention provides thermal protection systems for assemblies or arrays of electrical or electronic components to be used primarily in surface mountable applications. This thermal protection system is especially applicable to surface mounting technologies that involve electrical assemblies having components that are temperature sensitive, such as temperature sensitive integrated circuits, lithium batteries, oscillator crystals, and non-volatile clock circuits. In particular, preferred embodiments use a heat shield to surround the assembly of electrical components, wherein a pocket is formed between said electrical component and said heat shield, which is preferably filled with insulating material, such as air, styrofoam, fiberglass wool, and closed cell insulator materials. At least one electrical component has at least one electrical lead. The heat shield permits the electrical lead(s) to increase in temperature sufficient to permit soldering of the electrical lead to a second electrical element, such as a printed circuit board. The heat shield preferably has an outer surface without sharp corners to provide for a minimal surface area of the smooth outer surface. The heat shield is preferably cheap, moldable, and able to withstand the temperature exposure found in modern surface mount packaging processes. The heat shield is preferably comprised of polyester, plastics, liquid crystal polymers, and polyphenylene sulfides. Heat shields in preferred embodiments are comprised of a reflective material to reduce heat to further minimize the absorption and conduction of heat by the heat shield. The reflective materials generally have a high emissivity of heat and low absorption of heat and are positioned on the outer surface of the heat shield and are comprised of a light shade paint or thermal control material, which are preferably deposited using vapor.

Additionally, preferred embodiments also include a heat sink to protect electrical components that are sensitive to extreme heat from heat. The heat sink preferably comprised of a heat capacity material that undergoes a phase transition that consumes heat in the range of from 30° Celsius to 140° Celsius. Preferred embodiments are generally comprised of bismuth-tin-lead eutectic alloy (which melts at approximately 93° Celsius), woods metal alloy (which melts at approximately 50° Celsius), and other low-melting point/low cost alloys. Additionally, the heat sink is comprised of a frame and a plug to hold the heat capacity material around the assembly of electrical components and away from the electrical lead(s) of the electrical components in the assembly.

Additionally, due to extra long leads and thin widths, the electrical lead(s) have a low cross sectional area. The electrical leads are often curved (i.e., 'gull wing lead'), which maximize the distance the heat will travel without increasing the size dimensions of the part. Temperature sensitive markers are also affixed to the outer surface of the heat sink to help monitor the temperature exposure. These markers change color to account for exposures to varying temperatures.

Methods of making a thermal protection system are also described as well. In particular, these steps comprise of providing an electrical element having at least one electrical lead, encapsulating said electrical element with a heat sink that leaves said electrical lead(s) uncovered, and covering said electrical element with a heat shield that leaves said electrical lead(s) uncovered.

The disclosed invention has the following advantages. First, the thermal protection system provides greater protection of temperature sensitive components from damage during surface mount reflow processes with a wide range of reflow profiles. Second, the use of phase change material provides greater flexibility in surface mount reflow processes. Third, the thermal protection system does not add a size premium. Fourth, the removable and add-on nature of the heat shield reduces assembly costs. Fifth, the use reflective materials on the heat shield reflects heat away from the electrical elements during process stages, but it is unsightly. The heat shield is removed (along with the removable heat shields), which preserves a good appearance for the final electrical product. Sixth, the heat shields used in preferred embodiments are removable and replaceable, therefore recyclable. Seventh, there is low thermal conductivity design of the leads to minimize conduction of heat into the package via the leads. Eighth, there are reduced labor costs with the disclosed thermal protection system.

BRIEF DESCRIPTION OF THE DRAWINGS

Further features and advantages will become apparent from the following and more particular description of the various embodiments of the invention, as illustrated in the accompanying drawings, wherein:

FIG. 1 is a cross section of a preferred embodiment of the thermal protection system for an assembly or array of;

FIGS. 2A and 2B are graphs illustrating heat absorption of preferred embodiments with and without heat sinks containing materials with a high heat capacity compared to embodiments without heat sinks containing materials with a high heat capacity and with and without reflective coating on the outer surface of the heat shield;

DETAILED DESCRIPTION OF THE PREFERRED EMBODIMENTS

Figure 1:
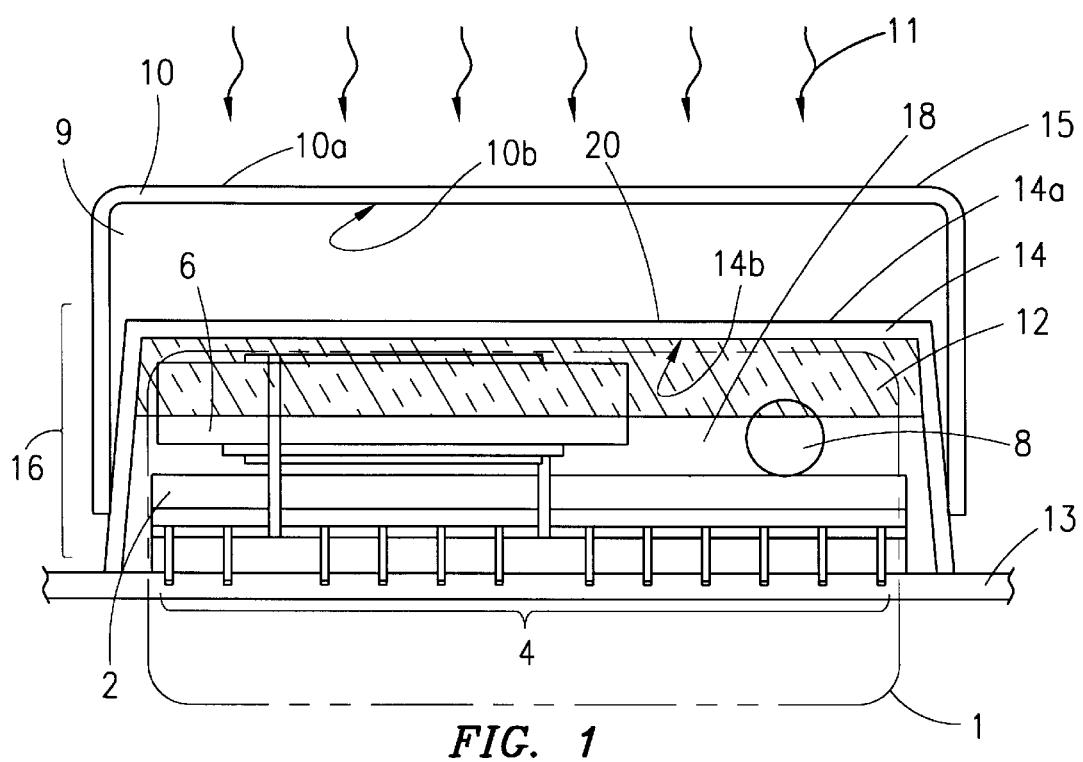

FIG. 1 is a cross section of a preferred embodiment of the thermal protection system for an array or assembly of electrical or electronc components, which is generally denoted by reference number 1. Assembly 1 comprises in this case a variety of electrical components: integrated circuit 2, lithium battery 6, and crystal 8, but could be a variety of other electrical components, such as a printed circuit board (see FIGS. 4A and 4B), which comprise of other electrical components as well. All of the electrical components of electrical assembly 1 are positioned proximate to one another. While FIG. 1 shows lithium battery 6 and crystal 8 positioned over the integrated circuit 2, other electrical elements could be positioned in other places, such as adjacent or beneath integrated circuit 2. Integrated circuit 2 has at least one component lead 4. As electrical element 1 moves through a surface mount reflow oven (not shown), surfaces of the electrical components of assembly 1 facing the surface mount reflow oven would typically absorb heat through convection and impinging radiation (IR) (in the infrared spectrum) and/or through condensation (i.e., vapor phase) from above, as referenced by heat waves 11.

As shown in FIG. 1, heat shield 10 is positioned over and around the electrical assembly 1 to reduce the heat that would be readily transferred to the internal portions of electrical element 1 via conduction or other means. Heat shield 10 of preferred embodiments generally caps or encloses assembly 1 and/or heat sink 16 and/or any other associated electrical components that are sensitive to temperature. Heat shield 10 in preferred embodiments has rounded corners and smooth outer profiles to the reduce the surface area of outer surface 10A of heat shield 10. However, the outer surface 10A of heat shield 10 could be rectangular in shape or other shapes, if certain board configurations, specific applications, or process limitations demand these shapes. For instance, heat shields could also enclose or cap only portions of assembly 1 and/or heat sink 16 and/or any other associated electrical coponents. Heat shield 10 effectively reduces the amount of heat entering electrical element 1 by greatly reducing conduction of heat 11 from the outer surface 10A of the heat shield 10 to the inner surface 10B and eventually to internal portions of the electrical components of assembly 1, but permits the conduction of heat 11 around heat shield 10 to component leads 4 to allow the leads 4 to bond to circuit board 13. Heat shield 10 in preferred embodiments is generally comprised of materials that are cheap, moldable, and able to withstand the temperature exposure found in modern surface mount packaging technology, such as polyesters, plastics, liquid crystal polymers, and polyphenylene sulfides.

Heat shield 10 also provides for pocket 9, which contains substances that have a much higher thermal resistances than most of the materials used in electrical components in assembly 1, such as air, fiberglass wool, and closed cell insulator materials (which are styrofoam like materials having bubbles of fluorocarbons). As a result, pocket 9 provided by heat shield 10 between the inner surface 10B of heat shield 10 and the outer surface of the assembly 1 (not shown in FIG. 1) or between the inner surface 10B of heat shield 10 and the outer surface 14B of frame 14 of heat sink 16, which faces inner surface 10B of heat shield 10 greatly decrease the conduction of heat into the assembly 1 and the additional electrical components.

The size of pocket 9 and the volume created by pocket 9 affects the resistance provided by pocket 9. Generally, large volumes created by pocket 9 are better than smaller volumes, but this relationship needs to be countered with the fact that the larger volumes are generally more cumbersome. The vertical height of pocket 9 provided by heat shield 10 may need to be limited in some applications. Preferred embodiments generally provide pockets with 100 to 600 mils in height and allow the width and length of the pockets to vary with the various sizes of electrical components 1. For instance, if the assembly include SOIC parts, pockets 9 in preferred embodiments have heights of approximately 250 mils. Preferred materials of heat shield 10 may also be thinned considerably to help compensate for these height requirements.

Preferred embodiments also coat or paint reflective substance 15 onto outer surface 10A of heat shield 10 or mold into the heat shield 10 to further minimize the absorption and conduction of heat by heat shield 10, especially in infrared environments. Reflective substance 15 generally comprise of a light shade of paint or gloss. Alternative preferred embodiments also include a thermal control material, which may be deposited by vapor onto outer surface 10A or placed on the back of a teflon tape or similar adhesive tape and stuck to outer surface 10A. These materials have the added advantage of being easily applied in addition to having a high emissivity with a low absorption. Moreover, if these materials become hot, they will reflect heat and/or radiate heat.

FIGS. 2A and 2B illustrate the effects of these reflective materials. FIG. 2A shows two curves relaying the heat absorption: curve 30 of thermal protection systems having heat sinks containing materials with a high heat capacity (which will be discussed below) and curve 32 of thermal protection systems without effective heat sinks or having heat sinks that do not contain materials with a high heat capacity. FIG. 2A corresponds to thermal protection systems that do not have reflective coating on the outer surface 10A of the heat shield 10. FIG. 2B shows two curves relaying the heat absorption: curve 34 of thermal protection systems having heat sinks containing materials with a high heat capacity (which will be discussed below) and curve 36 of thermal protection systems without effective heat sinks or having heat sinks that do not contain materials with a high heat capacity. FIG. 2B corresponds to thermal protection systems that do have reflective coating on the outer surface 10A of the heat shield 10.

Heat shield 10 and pocket 9 could be permanent additions to assembly 1, but this is not necessary. In fact, since heat shield 10 is only needed during the assembly portion of assembly 1, preferred embodiments of the heat shield 10 are removable and recyclable. Additionally, removing heat shield 10 prevents it from adding any unnecessary height to existing assembly 1 during other phases of manufacturing processes, which is a critical concern in all microelectric packaging technology. Furthermore, making and using a removable heat shield 10 is cheaper than making heat shield 10 permanent, because of the associated costs of heat shield 10 and the design adjustments needed to make pocket 9 a more integral part of the design. The removable cap lends itself to the use of a reflective material, which is unsightly on a package which will stay of the finished board.

As shown in FIG. 1, preferred embodiments also use a heat sink 16 positioned encompassing an encapsulating assembly 1 and associated electrical components (i.e., lithium battery 6 and crystal 8) to absorb heat that would otherwise be absorbed by the body of assembly 1. Heat sink 16 is comprised of a frame 14, heat capacity material 12 that has a high heat capacity, and holding material 18 that holds heat capacity material 12 in place. Materials with a high heat capacity require more heat to increase in temperature and, as high heat capacity materials undergo a phase change, they absorb heat without increasing in temperature at all (see FIGS. 3). Thus, by using heat capacity materials 12 in heat sink 16 and positioning heat sink over assembly 1, heat sink 16 effectively increases the amount of heat that can be applied to assembly 1 before exceeding a critical temperature. Preferred embodiments use materials in a reservoir that undergo a phase change in the area of from 30° Celsius to 140° Celsius for heat capacity materials 12, such as hydrated salts, Sodium carbonate monohydrate, low melting point metal alloys, and some organic materials (preferably non-flammable organic materials). Preferred materials are generally non-combustible.

Figure 3:
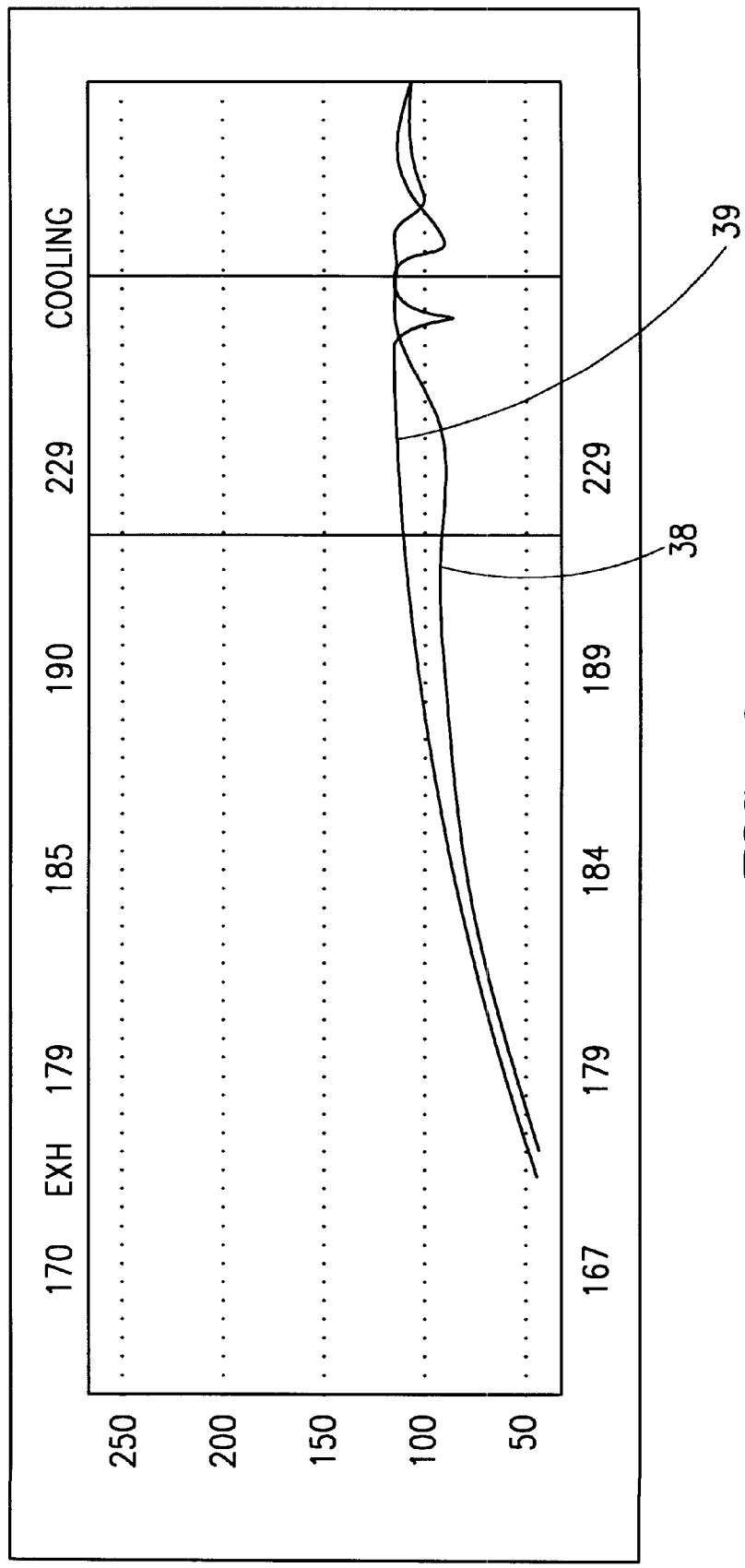
FIG. 3 is a characteristic graph of a preferred phase change material used for the heat capacity material utilized in preferred embodiments with heat sinks containing materials with a high heat capacity compared to embodiments without heat sinks containing materials with a high heat capacity.

FIG. 3 shows a characteristic graph of preferred phase change material used for heat capacity materials 12 of this type, more particularly, of a bismuth-tin-lead eutectic alloy that melts at 93° Celsius with a heat of fusion of about 10 Kcal/gm. Alternate perferred embodiments use woods metal alloy (which melts at approximately 50° Celsius) and other low-melting point/low-cost alloys for the phase change material. Please note that typical materials used have a high heat of fusion and provide the greatest amount of protection, but glass transition and other phase changes are relevant. In addition, the size of reservoir holding high heat capacity material 12 is relevant as well; generally, the larger the reservoir, the greater the heat capacity. For instance, depending on the application, the height of reservoir holding heat capacity materials 12 in preferred embodiments ranges from 0.100" to 0.400". Holding materials 18, such as Alumina filled epoxies, Amicon™, Sylgard™, encapsulate electrical elements 1 to protect assembly 1 from heat, so that the reservoir of heat capacity materials 12 do not seep or leak out when they undergo the expected phase change to states that are more malleable and more difficult to contain (i.e., solid to liquid). Heat sink 16 has the added advantage of only a minor increase in size.

As shown in FIG. 1, since a significant amount of heat is conducted into electrical component 2 through component leads 4, preferred embodiments of the thermal protection system also utilize enhanced designs of component leads 4. In particular, component leads 4 generally approach 215° Celsius to permit a good solder joint formation and metal is a good thermal conductor. Preferred embodiments use low thermal conductivity lead frame metal for component leads 4 and also reduce the cross section of component leads 4. Moreover, preferred embodiments also increase the length of component leads 4 to reduce heat transferred to electrical element 1 via component leads 4. As a result, component leads 4 have minimal cross-sectional areas of 0.00009 in$^2$ with widths of approximately 0.015", thickness of approximately 0.006", and lengths of approximately 0.100". Leads 4 in preferred embodiments are curved, as in gull wing leads. Forming the leads 4 in this fashion enable these features to be incorporated into the thermal protection system without greatly increasing or altering the height and width of existing parts. As a result, existing manufacturing processes do not need to be redesigned or modified to accommodate embodiments with longer leads 4.

As shown in FIG. 1, marker 20 is affixed to the outer surface 14A of frame 14 of heat sink 16. Marker 20 is sensitive to temperature and may be affixed in liquid form using a dropper or via a tape. Marker 20 is preferably placed on the outer surface 14A of frame 14, because that surface is relatively close in temperature to the high heat capacity material inside electrical element 1. This condition would be particularly true if a metallic low melting point alloy was used for frame 14, because it will have a very small temperature shift across it due to the high thermal conductivity of metal and because heat shield 19 protects the outer surface(s) of electrical components of assembly 1 from direct exposure to the oven environment (not shown). Marker 20 could also be placed on a host of other surfaces, such as inner surface 10B of heat shield 10, so long as the temperature reached of electrical element 1 and associated electrical components can be predicted across pocket 9 and through heat sink 16, given known and stable materials in the composites. Preferred embodiments use temperature sensitive tape as marker 20 that responds to exceeding certain temperature limits by changing color, which are commonly available. Examples include products made by Omega engineering. Marker 20 provides an external visual check to guarantee that the critical components (i.e., electrical element 1, including lithium battery 6, and crystal 8) did not see excessive temperatures and, thus, increase the quality assurance of the thermal protection system. While marker 20 could be removed, preferred embodiments leave marker 20 on for the life of the part.

Figure 4A:
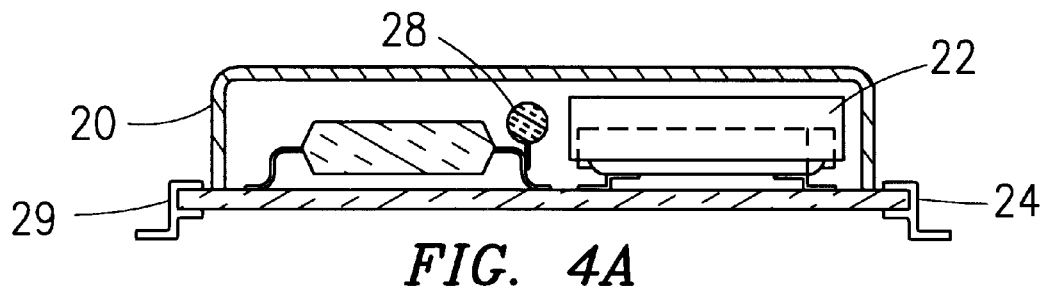
FIGS. 4A and 4B are cross section and top view and side view of a preferred embodiment of the thermal protection system for an an array or assembly of electrical components wherein the electrical component is a printed circuit board having a variety of electrical components applied thereto.
Figure 4B:
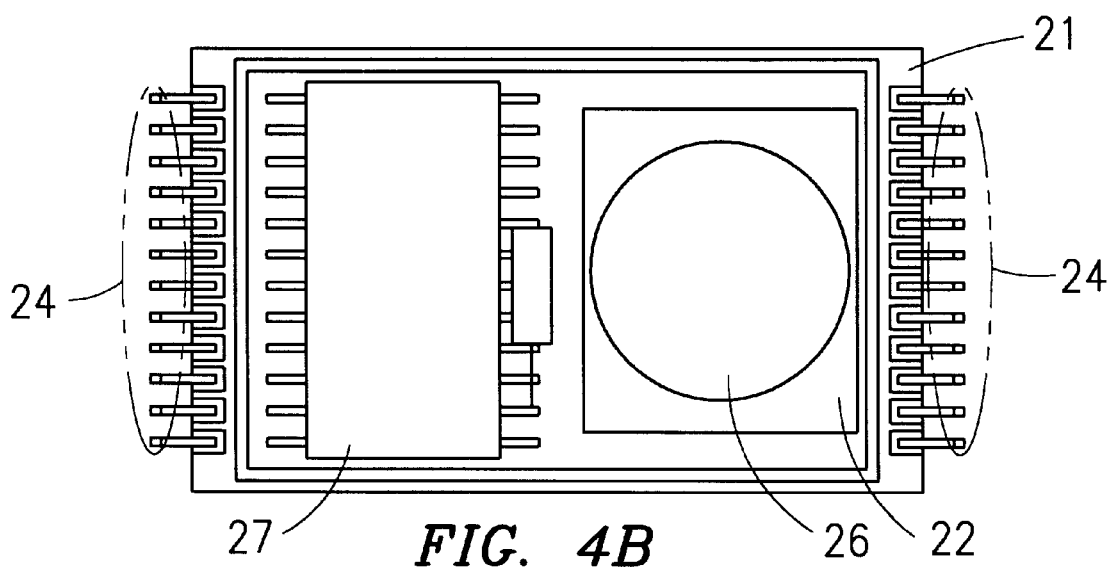

FIGS. 4A and 4B are cross section and top view of a preferred embodiment of the thermal protection system for an electrical assembly 1 (as in FIG. 1), wherein electrical module is a printed circuit board 21 having a variety of electrical components. At least one component of assembly 1 has component leads 24. Printed circuit board 21 has a host of additional electrical components positioned proximate to it, such as lithium battery 26 and crystal 28. As in FIG. 1, while FIGS. 2A and 2B show lithium battery 6 and crystal 8 positioned over printed circuit board 21, other electrical components could be positioned in other places, such as component 27, which is a SOIC, positioned adjacent to lithium battery 26 and over printed circuit board 21. Moreover, FIGS. 4A and 4B also demonstrate an added feature of the thermal protection system, which is that selected structures may be selectively applied to enhance the thermal protection of particular electrical components comprising assembly 1, which may be temperature sensitive. In particular, FIG. 4A shows heat shield 20 surrounding all of the electrical components of assembly 1 and heat sink 22 only covering some of the electrical components 26. As discussed above, as electrical element 21, which comprised of printed circuit board 21, lithium battery 26 and crystal 28, moves through a surface mount reflow oven (not shown), surfaces of the electric element facing the surface mount reflow oven would typically absorb heat through convection and IR and/or through condensation (vapor phase).

It should be noted that while heat shield 10, heat sink 16, and the specific component leads 4 described above could be used individually or selectively with one another to address the overheating of assembly of components and additional electrical components (i.e., lithium battery 6 and crystal 8), electrical components 2 may still be susceptible to overheating in more aggressive reflow environments. As a result, preferred embodiments generally use the heat shield 10, heat sink 16, and specific component leads 4 together to add additional factors of thermal protection as well as greater temperature control.

FURTHER MODIFICATIONS AND VARIATIONS

Although the invention has been described with reference to a specific embodiment, this description is not meant to be construed in a limiting sense. As described above, various modifications of the disclosed embodiment as well as alternate embodiments of the invention will become apparent to persons skilled in the art upon reference to the description of the invention. Accordingly, it should be understood that the modifications and variations suggested above and below are not intended to be exhaustive. These examples help show the scope of the inventive concepts, which are covered in the appended claims. The appended claims are intended to cover these modifications and alternate embodiments.

What is claimed is:

1. A thermal protection system, comprising:
   (a) an electrical assembly of electrical components, at least one component of said electrical assembly of electrical components comprising an integrated circuit, said at least one component of said electrical assembly of electrical components also having at least one electrical lead having a proximate portion and a distal portion, which at least one electrical lead is coupled to said integrated circuit and extending outward and away from said electrical assembly of electrical components; and
   (b) a removably sealable heat shield surrounding completely at least one portion of said electrical assembly of electrical components and forming a first pocket enclosed between said at least one portion of said electrical assembly of electrical components and said heat shield, said first pocket containing high heat compacity thermal insulators, said thermal insulators including phase change media, said heat shield covering said proximate portion but not said distal portion of said at least one electrical lead extending outward and away from said electrical assembly of electrical components, so that said at least one electrical lead can be heated by an external heat source to a temperature sufficient to solder said at least one electrical lead to a second electrical component of said electrical assembly of electrical components.

2. The thermal protection system of claim 1, wherein a second electrical component of said electrical assembly of electrical components is a printed circuit board.

3. The thermal protection system of claim 1, said at least one electrical lead is gull wing shaped.

4. The thermal protection system of claim 1, wherein said heat shield has an outer surface having a surface area without sharp corners to minimize said surface area of said outer surface.

5. The thermal protection system of claim 1, wherein said electrical assembly of electrical components is comprised of at least one electrical component selected from the group consisting of temperature sensitive integrated circuits, lithium batteries, oscillator crystals, and non-volatile clock circuits.

6. The thermal protection system of claim 1, wherein said heat shield is inexpensive, moldable, and able to withstand the temperature exposure found in surface mount packaging processes.

7. The thermal protection system of claim 1, wherein said heat shield is comprised of materials selected from the group consisting of polyesters, plastics, liquid crystal polymers, and polyphenylene sulfides.

8. The thermal protection system of claim 1, wherein said insulating material is selected from the group consisting of air, fiberglass wool, styrofoam, and closed cell insulator materials.

9. The thermal protection system of claim 1, wherein said heat shield comprises a reflective material positioned on an outer surface of said heat shield to further reduce absorption and conduction of heat by said heat shield, said reflective material having high emissivity of heat and low absorption of heat so that heat reaching said portion of said electrical assembly of electrical components surrounded by said heat shield is reduced.

10. The thermal protection system of claim 9, wherein an outer surface of said heat shield reflects incoming heat.

11. The thermal protection system of claim 9, wherein said reflective material is selected from the group consisting of a light shade paint or thermal control material.

12. The thermal protection system of claim 10, wherein a reflective material is deposited on at least a portion of an outer surface of said heat shield to make said heat shield reflective using vapor.

13. The thermal protection system of claim 1, wherein said said heat shield is removable.

14. The thermal protection system of claim 1, further comprising a heat sink encapsulating said at least one portion of said electrical assembly of electrical components, said heat sink only covering said proximate portion of said at least one electrical lead extending outward and away from said electrical assembly of electrical components, so that said at least one electrical lead can increase in temperature sufficient to solder said at least one electrical lead to a second electrical component of said electrical assembly.

15. The thermal protection system of claim 14, wherein said heat sink forms a second pocket between said heat sink and said electrical assembly of electrical components said second pocket filled with high heat capacity material.

16. The thermal protection system of claim 15, wherein said heat capacity material undergoes a phase transition that absorbs heat in the range of from 30° Celsius to 140° Celsius.

17. The thermal protection system of claim 15, wherein said heat capacity material is selected from the group consisting of bismuth-tin-lead alloy, woods metal alloy, and any combination thereof.

18. The thermal protection system of claim 17, wherein said heat sink comprises a frame holding said heat capacity material around said at least one portion of said electrical assembly of electrical components and a plug positioned within said frame holding said heat capacity material around said at least one portion of said electrical assembly of electrical components and keeping said heat capacity material away from said at least one electrical lead.

19. The thermal protection system of claim 14, wherein said heat sink has an outer surface with a marker that is sensitive to temperature.

20. The thermal protection system of claim 19, wherein said marker changes color depending when exposed to a specific temperature.

21. A thermal protection system, comprising:
(a) an electrical assembly of electrical components, at least one electrical component of said electrical assembly of electrical components comprising an integrated circuit, at least one electrical component of said electrical assembly of electrical components also having at least one electrical lead having a proximate portion and a distal portion, which at least one electrical lead extends outward and away from said electrical assembly of electrical components; and
(b) a removable heat sink completely surrounding at least one portion of said electrical assembly of electrical components to protect said at least one portion from heat generated by an external heat source, said heat sink having a cavity substantially filled with high heat capacity thermal insulators, said thermal insulators including phase change media said heat sink covering said proximate portion but not said distal portion of said at least one electrical lead extending outward and away from said electrical assembly of electrical components, so that said heat generated by said external heat source can heat said at least one electrical lead to a temperature sufficient to solder said at least one electrical lead to a second electrical assembly having at least one electrical component.

22. The thermal protection system of claim 21, wherein said heat capacity material undergoes a phase transition that consumes heat in the range of from 30° Celsius to 140° Celsius.

23. The thermal protection system of claim 21, wherein said heat capacity material is selected from the group consisting of bismuth-tin-lead alloy, woods metal alloy, and any combination thereof.

24. The thermal protection system of claim 21, wherein said heat sink comprises a frame and a plug positioning said heat capacity material around said at least one electrical component and away from said at least one electrical lead to permit said at least one electrical lead to heat up to appropriate temperatures so that said at least one electrical lead can be soldered to a printed circuit board disposed in proximity to said electrical assembly of electrical components, without damaging said at least one electrical component.

25. The thermal protection system of claim 21, wherein said heat sink has an outer surface and a marker attached to said outer surface, said marker alters its appearance when exposed to specific changes in temperature.

26. The thermal protection system of claim 21, wherein said at least one electrical lead is gull wing shaped.

* * * * *